United States Patent
Chen

(10) Patent No.: US 8,288,451 B2
(45) Date of Patent: Oct. 16, 2012

(54) PHOTO-CURABLE RESIN COMPOSITION FOR ULTRAVIOLET LIGHT-LED IRRADIATION

(75) Inventor: Chunfu Chen, Tsurumi-Ku Yok (JP)

(73) Assignee: Henkel Corporation, Rocky Hill, CT (US)

( * ) Notice: Subject to any disclaimer, the term of this patent is extended or adjusted under 35 U.S.C. 154(b) by 7 days.

(21) Appl. No.: 13/117,385

(22) Filed: May 27, 2011

(65) Prior Publication Data

US 2011/0230585 A1    Sep. 22, 2011

Related U.S. Application Data

(63) Continuation of application No. PCT/JP2009/071036, filed on Dec. 17, 2009.

(30) Foreign Application Priority Data

Dec. 18, 2008 (JP) ................................. 2008-322258

(51) Int. Cl.
*C08F 2/50* (2006.01)
*C08J 3/28* (2006.01)

(52) U.S. Cl. ........ 522/137; 522/180; 522/182; 522/185; 522/113; 522/114; 522/120; 522/121; 522/124; 522/125; 522/128

(58) Field of Classification Search .................. 522/180, 522/182, 185, 186, 113, 114, 120, 121, 124, 522/125, 127, 128
See application file for complete search history.

(56) References Cited

U.S. PATENT DOCUMENTS

| 7,662,868 B2 * | 2/2010 | Nakamura ..................... 522/144 |
| 2006/0223937 A1 * | 10/2006 | Herr et al. ..................... 524/556 |
| 2007/0117917 A1 * | 5/2007 | Herr et al. ..................... 524/556 |
| 2007/0291081 A1 * | 12/2007 | Kanno et al. ..................... 347/61 |

FOREIGN PATENT DOCUMENTS

| JP | 8-100123 | 4/1996 |
| JP | 10-60114 | 3/1998 |
| JP | 11-21352 | 1/1999 |
| JP | 2006-213924 | 8/2006 |
| JP | 2006-342204 | 12/2006 |
| JP | 2008-163183 | 7/2008 |
| JP | 2008-231409 | 10/2008 |

OTHER PUBLICATIONS

International Search Report for International Application No. PCT/JP2009/071036 mailed on Mar. 9, 2010.

* cited by examiner

*Primary Examiner* — Sanza McClendon
(74) *Attorney, Agent, or Firm* — Steven C. Bauman

(57) ABSTRACT

A photo-curable resin composition for the UV-LED light source, which is rapidly cured and particularly has excellent surface curing property, is disclosed. The resin composition contains (a) polybutadiene (meth)acrylate; (b) a polythiol compound; and (c) a photo radical initiator and is photo-curable by an irradiation with an ultraviolet light-LED. Accordingly, production efficiency can be significantly increased in the production of liquid crystal displays and electrical and electronic components.

4 Claims, No Drawings

PHOTO-CURABLE RESIN COMPOSITION FOR ULTRAVIOLET LIGHT-LED IRRADIATION

The present invention relates to a photo-curable resin composition, which is cured by irradiation with an ultraviolet light-LED.

BACKGROUND

In recent years, light emitting diodes have been used as an alternative to the conventional light sources in a variety of fields due to their thrifty power consumption. Ultraviolet light-LEDs (hereafter, UV-LEDs) have been also proposed for use as a light source curing photo-curable resins (the patent document 1: JP-A-2008-163,183). UV-LEDs generally have single-peaked wavelength distribution. Use of the UV-LED having its peak at, for example, 360 nm to 370 nm is expected to decrease ultraviolet light damage caused by mainly short-wavelength, and together to increase production efficiency.

However, UV-LED is deficient in the light with short-wavelength (for example, a range not longer than 300 nm, yet even not longer than 350 nm) required to reduce oxygen inhibition and to achieve acceptable surface curing. Consequently, curing by means of UV-LED as a light source presents a problem with defective curing of resin surface due to oxygen inhibition.

List of Documents
Patent document 1: JP-A-2008-163,183
Patent document 2: JP-A-H1-22,927 (JP-B-H6-60,238)

SUMMARY

The present inventor was dedicated to examining to achieve photo-curable resin composition suitable for the UV-LED light source. However, the surface curing property in use of the conventional light source was hardly correlated with the surface curing property in use of the UV-LED.

For example, the photo-curable resin composition which comprises a polyene compound or a (meth)acrylate compound, and a polythiol compound is known (for example, see the patent document 2: JP-A-H1-22,927, the "BACKGROUND ART" section). However, it was extremely difficult to find a suitable composition because the surface curing property degraded when the polythiol compound is added, or the surface curing property degraded in use of the UV-LED whereas the surface curing property was excellent in use of a high-pressure mercury lamp.

Under this circumstance, the present inventor discovered that the combination of the specific (meth)acrylate component and polythiol compound would provide the photo-curable resin composition with excellent surface curing property, and herewith the inventor accomplished the present invention.

Accordingly, the present invention relates to the following items.
1. A resin composition photo-curable by irradiation with an ultraviolet light-LED, comprising:
   (a) polybutadiene (meth)acrylate;
   (b) a polythiol compound; and
   (c) a photo radical initiator.
2. A composition according to the above item 1, wherein the composition comprises 0.5 to 100 weight parts of the polythiol compound (b) and 0.1 to 20 weight parts of the photo radical initiator (c) based on 100 weight parts of the polybutadiene (meth)acrylate (a).
3. A composition according to the above item 1 or 2, wherein the polythiol compound comprises a polythiol compound including 3 or more SH groups in one molecule.
4. A composition according to any one of claims 1 to 3, further comprising 10 to 200 weight parts of a (meth)acrylic-based monomer and/or a (meth)acrylic-based oligomer based on 100 weight parts of the polybutadiene (meth)acrylate (a).

The present invention can provide the photo-curable resin composition for the UV-LED light source, which is rapidly cured and particularly has excellent surface curing property. Consequently, production efficiency can be significantly increased in the production of liquid crystal displays and electrical and electronic components.

Furthermore, the composition according to the present invention is suitable for a moistureproof coating agent of electrode materials such as, for example, ITO because the composition is excellent in moisture resistance and adhesion.

DETAILED DESCRIPTION OF THE INVENTION

The (a) polybutadiene (meth)acrylate to be used in the present invention has polybutadiene structure in its molecule, and it has (meth)acryloyl group at its terminal. It is preferably liquid and has a viscosity in a range from 1,000 to 1,000,000 cps, more preferably a viscosity in a range from 2,000 to 700,000 cps at 25° C. The polybutadiene structure may be either 1,2-polybutadiene structure or 1,4-polybutadiene structure, and they both may further be contained as being mixed in a molecule.

Specific examples include liquid polybutadiene (meth)acrylate obtained by urethane addition reaction of 2-hydroxyethyl (meth)acrylate with hydroxyl group which liquid polybutadiene has through 2,4-tolylene diisocyanate; liquid polybutadiene (meth)acrylate obtained by esterification reaction of 2-hydroxy (meth)acrylate with maleinated polybutadiene to which maleic anhydride was added by ene addition reaction; liquid polybutadiene (meth)acrylate obtained by epoxy-esterification reaction of glyeidyl (meth)acrylate with carboxyl group which liquid polybutadiene has; liquid polybutadiene (meth)acrylate obtained by esterification reaction of (meth)acrylic acid with epoxidized polybutadiene obtained by acting epoxidation agent on liquid polybutadiene; liquid polybutadiene (meth)acrylate obtained by dehydrochlorination reaction of (meth)acrylyl chloride with liquid polybutadiene having hydroxyl group; liquid hydrogenated 1,2-polybutadiene (meth)acrylate obtained by modification of liquid 1,2-polybutadiene glycol with urethane-(meth)acrylate and the like.

These are available under the product names of TEA-1000 and TE-2000 from Nippon Soda Co., Ltd., the product names of BAC-45, BAC-15, SPBDA-30, Spbda-50 from Osaka Organic Chemical Industry Ltd., the product names of CN301, CN303, CN307 from Sartomer Company Inc.

The (b) polythiol compounds to be used in the present invention are those having 2 or more SH groups in its molecule. Specifically, aliphatic polythiol compounds include dithiol compound such as 1,2-ethanedithiol, 1,2-propanedithiol, 1,3-propanedithiol, 1,4-butanedithiol, 1,6-hexanedithiol, 1,7-heptanedithiol, 1,8-octanedithiol, 1,9-nonanedithiol, 1,10-decanedithiol, 1,12-dodecanedithiol, 2,2-dimethyl-1,3-propanedithiol, 3-methyl-1,5-pentanedithiol, 2-methyl-1,8-octanedithiol, 1,4-cyclohexanedithiol, 1,4-bis(mercaptomethyl)cyclohexane, 1,1-cyclohexanedithiol, 1,2-cyclohexanedithiol, bicyclo[2,2,1]hept-exo-cis-2,3-dithiol, 1,1-bis(mercaptomethyl)cyclohexane, bis(2-mercaptoethyl)ether, ethylene glycol bis(2-mercaptoacetate) and ethylene glycol bis(3-mercaptopropionate);

trithiol compound such as 1,1,1-tris(mercaptomethyl)ethane, 2-ethyl-2-mercaptomethyl-1,3-propanedithiol, 1,2,3-propanetrithiol, trimethylolpropane tris(2-mercaptoacetate), trimethylolpropane tris(3-mercaptopropionate) and tris((mercaptopropionyloxy)-ethyl)isocyanurate; and thiol compound having 4 or more SH groups such as pentaerythritol tetrakis(2-mercaptoacetate), pentaerythritol tetrakis(3-mercaptopropionate), pentaerythritol tetrakis(3-mercaptobutanate) and dipentaerythritol hex-3-mercaptopropionate.

Furthermore, aromatic polythiol compounds include 1,2-dimercaptobenzene, 1,3-dimercaptobenzene, 1,4-dimercaptobenzene, 1,2-bis(mercaptomethyl)benzene, 1,3-bis(mercaptomethyl)benzene, 1,4-bis(mercaptomethyl)benzene, 1,2-bis(2-mercaptoethyl)benzene, 1,3-bis(2-mercaptoethyl)benzene, 1,4-bis(2-mercaptoethyl)benzene, 1,2-bis(2-mercaptoethyleneoxy)benzene, 1,3-bis(2-mercaptoethyleneoxy)benzene, 1,4-bis(2-mercaptoethyleneoxy)benzene, 1,2,3-trimercaptobenzene, 1,2,4-trimercaptobenzene, 1,3,5-trimercaptobenzene, 1,2,3-tris(mercaptomethyl)benzene, 1,2,4-tris(mercaptomethyl)benzene, 1,3,5-tris(mercaptomethyl)benzene, 1,2,3-tris(2-mercaptoethyl)benzene, 1,2,4-tris(2-mercaptoethyl)benzene, 1,3,5-tris(2-mercaptoethyl)benzene, 1,2,3-tris(2-mercaptoethyleneoxy)benzene, 1,2,4-tris(2-mercaptoethyleneoxy)benzene, 1,3,5-tris(2-mercaptoethyleneoxy)benzene, 1,2,3,4-tetramercaptobenzene, 1,2,3,5-tetramercaptobenzene, 1,2,4,5-tetramercaptobenzene, 1,2,3,4-tetrakis(mercaptomethyl)benzene, 1,2,3,5-tetrakis(mercaptomethyl)benzene, 1,2,4,5-tetrakis(mercaptomethyl)benzene, 1,2,3,4-tetrakis(2-mercaptoethyl)benzene, 1,2,3,5-tetrakis(2-mercaptoethyl)benzene, 1,2,4,5-tetrakis(2-mercaptoethyl)benzene, 1,2,3,4-tetrakis(2-mercaptoethyleneoxy)benzene, 1,2,3,5-tetrakis(2-mercaptoethyleneoxy)benzene, 1,2,4,5-tetrakis(2-mercaptoethyleneoxy)benzene, 2,2'-dimercaptobiphenyl, 4,4'-thiobis-benzenethiol, 4,4'-dimercaptobiphenyl, 4,4'-dimercaptobibenzyl, 2,5-toluenedithiol, 3,4-toluenedithiol, 1,4-naphthalenedithiol, 1,5-naphthalenedithiol, 2,6-naphthalenedithiol, 2,7-naphthalenedithiol, 2,4-dimethylbenzene-1,3-dithiol, 4,5-dimethylbenzene-1,3-dithiol, 9,10-anthracenedimethanethiol, 1,3-bis(2-mercaptoethylthio)benzene, 1,4-bis(2-mercaptoethylthio)benzene, 1,2-bis(2-mercaptoethylthiomethyl)benzene, 1,3-bis(2-mercaptoethylthiomethyl)benzene, 1,4-bis(2-mercaptoethylthiomethyl)benzene, 1,2,3-tris(2-mercaptoethylthio)benzene, 1,2,4-tris(2-mercaptoethylthio)benzene, 1,3,5-tris(2-mercaptoethylthio)benzene, 1,2,3,4-tetrakis(2-mercaptoethylthio)benzene, 1,2,3,5-tetrakis(2-mercaptoethylthio)benzene, 1,2,4,5-tetrakis(2-mercaptoethylthio)benzene and the like.

Furthermore, polythiol compounds having sulfide bond in their molecules include bis(2-mercaptoethyl)sulfide, bis(2-mercaptoethylthio)methane, 1,2-bis(2-mercaptoethylthio)ethane, 1,3-bis(2-mercaptoethylthio)propane, 1,2,3-tris(2-mercaptoethylthio)propane, tetrakis(2-mercaptoethylthiomethyl)methane, 1,2-bis(2-mercaptoethylthio)propanethiol, 2,5-dimercapto-1,4-dithiane, bis(2-mercaptoethyl)sulfide, 3,4-thiophenedithiol, 1,2-bis(2-mercaptoethyl)thio-3-mercaptopropane, bis-(2-mercaptoethylthio-3-mercaptopropane)sulfide and the like.

Particularly preferable polythiol compounds are trivalent (having 3 or more SH groups) or more (generally, about octavalent or less) aliphatic polythiols, and particularly preferred is trimethylolpropane tris(2-mercaptoacetate), trimethylolpropane tris(3-mercaptopropionate), tris((mercaptopropionyloxy)-ethyl)isocyanurate, pentaerythritol tetrakis(2-mercaptoacetate), pentaerythritol tetrakis(3-mercaptopropionate), pentaerythritol tetrakis(3-mercaptobutanate), dipentaerythritol hex-3-mercaptopropionate and the like.

In the composition according to the present invention, it is preferable that at least a portion of the polythiol compounds to be contained are trivalent or more (generally, about octavalent or less) polythiol compounds, and the entire polythiol compounds to be contained may be trivalent or more polythiol compounds.

In the composition, the content ratio of the (b) polythiol compound is usually 0.5 to 100 weight parts, preferably 2 to 50 weight parts, and more preferably 5 to 30 weight parts based on 100 weight parts of the polybutadiene (meth)acrylate.

The (c) photo radical initiator may be a compound which generates radicals by ultraviolet photo-irradiation with emission wavelength of UV-LED.

The photo radical initiator may include acetophenone-based initiator such as diethoxyacetophenone and benzyl dimethyl ketal, benzoin ether-based initiator such as benzoin and benzoin ethyl ether, benzophenone-based initiator such as benzophenone and methyl o-benzoylbenzoate, α-diketone-based initiator such as butanedione, benzyl and aceto naphthophenone, and thio compound such as methylthioxanthone.

More specific examples include benzoin, benzoin methyl ether, benzoin ethyl ether, benzoin isopropyl ether, benzoin-n-butyl ether, benzoin isobutyl ether, acetophenone, dimethylaminoacetophenone, 2,2-dimethoxy-1,2-diphenylethan-1-one, 2,2-dimethoxy-2-phenylacetophenone, 2,2-diethoxy-2-phenylacetophenone, 2-hydroxy-2-methyl-1-phenylpropane-1-one, 1-hydroxycyclohexyl phenyl ketone, 2-methyl-1-[4-(methylthio)phenyl]-2-morpholino-propane-1-one, 4-(2-hydroxyethoxy)phenyl-2(hydroxy-2-propyl)ketone, benzophenone, p-phenylbenzophenone, 4,4'-diethylamino benzophenone, dichlorobenzophenone, 2-methylanthraquinone, 2-ethylanthraquinone, 2-tert-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenonedimethyl ketal, acetophenonedimethyl ketal, p-dimethylamine benzoate, oligo(2-hydroxy-2-methyl-1-[4-(1-propenyl)phenyl]propanone) and the like.

Particularly preferable initiator has strong absorption in a wavelength region not shorter than 350 nm, and it includes, for example, Irgacure 369 (2-benzyl-2-(dimethylamino)-1-[4-(4-morpholinyl)phenyl]-1-butanone), Irgacure 907 (2-methyl-1-[4-(methylthio)phenyl]-2-(4-morpholinyl)-1-propanone), Irgacure 819 (phenylbis(2,4,6-trimethylbenzoyl)-phosphineoxide), Darocure TPO (diphenyl(2,4,6-trimethylbenzoyl)phosphine oxide) made by Ciba, and the like.

In addition to the photo radical initiator, known sensitizers may also be used.

The content of the (c) photo radical initiator is usually 0.1 to 20 weight parts, and preferably 1 to 10 weight parts based on 100 weight parts of the polybutadiene (meth)acrylate.

In the composition according to the present invention, (meth)acrylic monomer and/or (meth)acrylic oligomer may be optionally used as components used in combination with the photo-curable resin in addition to the aforementioned polybutadiene (meth)acrylate.

Monofunctional (meth)acrylic monomers include, for example, butanediol mono(meth)acrylate, cyclohexyl (meth)acrylate, dicyclopentanyl (meth)acrylate, dicyclopentenyl (meth)acrylate, dicyclopentenyloxyethyl (meth)acrylate, N,N-diethylaminoethyl (meth)acrylate, 2-ethoxyethyl (meth)acrylate, 2-hydroxyethyl (meth)acrylate, 2-hydroxypropyl (meth)acrylate, caprolactone-modified 2-hydroxyethyl (meth)acrylate, isobornyl (meth)acrylate, lauryl (meth) acrylate, acryloylmorpholine, N-vinylcaprolactam, nonylphenoxypolyethylene glycol (meth)acrylate, nonylphenoxypolypropylene glycol (meth)acrylate, phenoxyethyl (meth)acrylate, phenoxyhydroxypropyl (meth)acrylate, phenoxydiethylene glycol (meth)acrylate, polyethylene glycol (meth)acrylate, polypropylene glycol (meth)acrylate, tetrahydrofurfuryl (meth)acrylate and the like.

Polyfunctional (meth)acrylic monomers include, for example, 1,4-butanediol di(meth)acrylate, dicyclopentanyl di(meth)acrylate, ethylene glycol di(meth)acrylate, dipentaerythritol hexa(meth)acrylate, caprolactone-modified dipentaerythritol hexa(meth)acrylate, 1,6-hexanediol di(meth)acrylate, neopentyl glycol di(meth)acrylate, pentaerythritol tri(meth)acrylate, polyethylene glycol di(meth) acrylate, polypropylene glycol di(meth)acrylate, tetraethylene glycol di(meth)acrylate, trimethylolpropane tri(meth) acrylate, tris(acryloxyethyl)isocyanurate, caprolactone-modified tris(acryloxyethyl)isocyanurate, tris (methacryloxyethyl)isocyanurate, tricyclodecane dimethanol di(meth)acrylate and the like.

These monofunctional (meth)acrylic monomers and polyfunctional (meth)acrylic monomers may be used solely or in combination with 2 or more monomers, or may be used in combination with the monofunctional and polyfunctional monomers.

Furthermore, the (meth)acrylic oligomers are those having at least one (meth)acryloyl group, and they include, for example, epoxy acrylate, urethane acrylate, polyester acrylate, polyol acrylate, polyether acrylate, silicone resin acrylate, melamine acrylate, and the like.

As a component used in combination, monofunctional (meth)acrylate compounds may be preferably used for viscosity adjustment and/or physical property adjustment. In a certain application, alicyclic (meth)acrylate compounds such as isobornyl acrylate are preferable.

The content ratio of the acrylic monomer and/or acrylic oligomer is preferably 0 to 300 weight parts, and more preferably 10 to 200 weight parts based on 100 weight parts of the polybutadiene (meth)acrylate.

The composition according to the present invention may further comprise additive, resin component and the like to improve or modify properties such as flowability, applying property, preserving property, curing property and physical property after curing.

The component that may be contained as needed includes, for example, organic or inorganic filler, thixotropic agent, silane coupling agent, diluent, modifier, coloring agent such as pigment and dye, surfactant, preservative-stabilizer, plasticizer, lubricant, defoamer, leveling agent and the like; however it is not limited to these. In particular, the composition preferably comprises an additive selected from the group consisting of a filler, a thixotropic agent and a silane coupling agent.

The filler includes, without particular limitation, for example, inorganic filler such as silica, diatomaceous earth, alumina, zinc oxide, iron oxide, magnesium oxide, tin oxide, titanium oxide, magnesium hydroxide, aluminium hydroxide, magnesium carbonate, barium sulphate, gypsum, calcium silicate, talc, glass bead, sericite activated white earth, bentonite, aluminum nitride, silicon nitride, and the like.

The thixotropic agent includes, without particular limitation, for example, talc, fine particle silica, superfine surface-treated calcium carbonate, fine particle alumina, plate-like alumina; layered compound such as montmorillonite; spicular compound such as aluminium borate whisker, and the like. Among them, talc, fine particle silica, fine particle alumina and the like are preferred.

The silane coupling agent includes, without particular limitation, γ-aminopropyltriethoxysilan, γ-mercaptopropyltrimethoxysilan, γ-methacryloxypropyltrimethoxysilan, γ-glycidoxypropyltrimethoxylsilan, SH6062, SZ6030 (above all, Toray-Dow Corning Silicone Inc.), KBE903, KBM803 (above all, Shin-Etsu Silicone Inc.) and the like.

The photo-curable resin composition according to the present invention may be obtained by mixing the aforementioned each component by means of, for example, a mixer such as a stirrer having stirring blades and a triple roll mill. The photo-curable resin composition is liquid at applying temperature, preferably ambient temperature (working environment temperature), and the materials to be formulated, in particular all the resin materials are not necessarily liquid.

The above-obtained composition according to the present invention is curable by photo-irradiation with UV-LED. For the employable UV-LED, any UV-LED may be used as long as its emission wavelength range overlaps the wavelength capable of activating the photo radical initiator. In application where UV damage on materials is to be avoided (for example, for liquid crystal display and the like), preferred is the UV-LED having a peak wavelength in a range not shorter than 300 nm, for example, a range of 350 nm to 380 nm, preferably a range of 360 nm to 370 nm.

By using the above UV-LED, curing a thickness of 300 μm (internal curing and tack free surface curing) can be conducted for a duration not longer than 30 seconds, more preferably not longer than 10 seconds with irradiation of 100 mW/cm$^2$ because the composition according to the present invention is excellent in surface curing property. The lower limit of the irradiation time of the UV-LED may be short as long as it is capable of curing; however, it is generally not shorter than about 0.5 seconds, for example, not shorter than about 1 second due to certainty of irradiation.

EXAMPLES

The materials shown in Table 1 were sufficiently well mixed by using a stirrer to give the composition. About 50 mg of the composition was applied on a slide glass plate, and was irradiated with light by the UV-LED or high-pressure mercury lamp. For the UV-LED equipment, ANUJ5012 made by Panasonic was employed and its irradiation intensity was set at 100 mW/cm$^2$. Furthermore, Technoflux IH-153 was employed for the high-pressure mercury lamp and its irradiation intensity was set at 100 mW/cm$^2$.

Surface Curing Property:

After the photo-irradiation for given duration, talcum powder was spread on the composition surface followed by lightly brushing away, and then the composition surface was observed and the tack-free time was determined (the talcum powder method). Insufficient surface-curing was determined when the talcum powder remained on the composition surface, whereas surface-curing completion was determined when no talcum powder remained on the composition surface. The tack-free time was given when the surface curing was completed.

Double Bond Conversion Ratio:

The double bond conversion ratio was determined by decrease in the absorption peak based on double bond by means of FT-IR for the sample before the photo-irradiation and the sample after the irradiation for 5 seconds with the UV-LED light source.

TABLE 1

| Composition | Examples 1 | Examples 2 | Comparative examples 1 | Comparative examples 2 | Comparative examples 3 |
|---|---|---|---|---|---|
| Nisso PB TE-2000*[1] | 43.3 | 43.3 | 48.2 | | |
| IBXA*[2] | 41.3 | 41.3 | 45.7 | 47 | 42 |
| CN-964*[3] | — | — | — | 47 | 42 |
| TMTP*[4] | 10.0 | | — | | 10 |
| Karenz MT PEI*[5] | | 10.0 | | | |
| Iragacure 369*[6] | 3.6 | 3.6 | 4.0 | 4.0 | 4.0 |
| Iragacure 907*[7] | 1.8 | 1.8 | 2.0 | 2.0 | 2.0 |
| TFT(sec.), at 100 mW/cm$^2$ | | | | | |
| UV-LED light source*[8] | 2 | 2 | >60 | >60 | >60 |
| High-pressure mercury source*[9] | 2 | 2 | 2 | 15 | >60 |
| Double bond conversion rate 100 mW/cm$^2$, 5 sec. UV-LED light source | 93.5% | 91.0% | 76.8% | Not measured | Not measured |

*[1] polybutadiene acrylate made by Nippon Soda Co., Ltd.
*[2] isobornyl acrylate made by Osaka Organic Chemical Industry Ltd.
*[3] urethane acrylate made by Sartomer Company Inc.
*[4] polythiol compound made by Yodo Kagaku Co., Ltd., trimethylolpropane tris(3-mercaptopropionate)
*[5] polythiol compound made by Showa Denko, pentaerythritol tetrakis (3-mercaptobutanate)
*[6], *[7] photo initiator made by Ciba Specialty Chemicals
*[8] Panasonic ANUJ 5012 was used.
*[9] Technoflux 1H-153 was used.
*TFT: tack-free time In comparison of the examples 1 and 2 with the comparative example 2, there is no difference in the tack-free time for the photo-irradiation with the high-pressure mercury lamp. However, for the photo-irradiation with the UV-LED, only the examples 1 and 2 containing the polythiol compound achieve rapid surface curing whereas the comparative example 1 containing no polythiol compound is bad in the surface curing property. Furthermore, in comparison of the example 1 with the comparative example 3, the combination of other (meth)acrylate oligomers than polybutadiene (meth)acrylate and the polythiols is bad in the surface curing property even when the polythiol was added. In particular, in comparison of the comparative example 2 with the comparative example 3, the surface curing property rather worsened by adding polythiol.

As is obvious above, a wide variety of modifications may be possible unless departing from the spirit of the present invention. Therefore, the embodiments illustrated here are examples, and they do not restrict the range of the present invention described in the scope of claims.

INDUSTRIAL APPLICABILITY

The present invention can provide the photo-curable resin composition for the UV-LED light source, which is rapidly cured and particularly has excellent surface curing property. Consequently, production efficiency can be significantly increased in the production of liquid crystal displays and electrical and electronic components.

What is claimed is:

1. A resin composition photo-curable by irradiation with an ultraviolet light-LED, comprising:
    (a) a combination of polybutadiene (meth)acrylate and isobornyl acrylate;
    (b) a polythiol compound; and
    (c) a photo radical initiator.

2. A composition according to claim 1, wherein the composition comprises 0.5 to 100 weight parts of the polythiol compound (b) and 0.1 to 20 weight parts of the photo radical initiator (c) based on 100 weight parts of the polybutadiene (meth)acrylate (a).

3. A composition according to claim 1, wherein the polythiol compound comprises a polythiol compound including 3 or more SH groups in one molecule.

4. A composition according to claim 1, further comprising 10 to 200 weight parts of a (meth)acrylic-based oligomer based on 100 weight parts of the polybutadiene (meth)acrylate (a).

* * * * *